(12) United States Patent
Scott et al.

(10) Patent No.: US 6,369,661 B1
(45) Date of Patent: Apr. 9, 2002

(54) PHASE INTERPOLATION CIRCUITS AND METHODS AND SYSTEMS USING THE SAME

(75) Inventors: Baker Scott; Marius Goldenberg; Pradeep Katikaneni; Russ Croman; Edmund Schneider, all of Austin, TX (US)

(73) Assignee: Cirrus Logic, Inc.

( * ) Notice: Subject to any disclaimer, the term of this patent is extended or adjusted under 35 U.S.C. 154(b) by 0 days.

(21) Appl. No.: 09/717,356

(22) Filed: Nov. 20, 2000

(51) Int. Cl.[7] .............................. H03B 5/24; H03L 7/099
(52) U.S. Cl. .............................. 331/45; 331/57; 331/74; 331/179
(58) Field of Search .............................. 331/45, 57, 74, 331/177 R, 179

(56) References Cited

U.S. PATENT DOCUMENTS 5,841,325 A * 11/1998 Knotts et al. ................. 331/57

OTHER PUBLICATIONS

Knotts, T. A. ; "A 500 MHz Time Digitizer IC with 15.625ps Resolution"; 1994 IEEE ISSCC; Session 3; Paper WP3.6; pp 58–59.*

"Sp 24.1:A 300Mb/s BiCMOS EP4 Read Channel for Magnetic Hard Drives" by Leung, et. al,ISSCC98/Session 24/Feb. 7, 1998 /Salon 8 2 pages, Digest of Technical papers.

* cited by examiner

Primary Examiner—David Mis
(74) Attorney, Agent, or Firm—James J. Murphy, Esq.; Winstead SEchrest & Minick

(57) ABSTRACT

A signal generator 600 includes oscillator circuitry for generating first and second signals having a selected phase relationship and an interpolator 610 for interpolating between a phase of the first signal and a phase of the second signal to generate a third signal having a phase between the phases of the first and second signals.

19 Claims, 8 Drawing Sheets

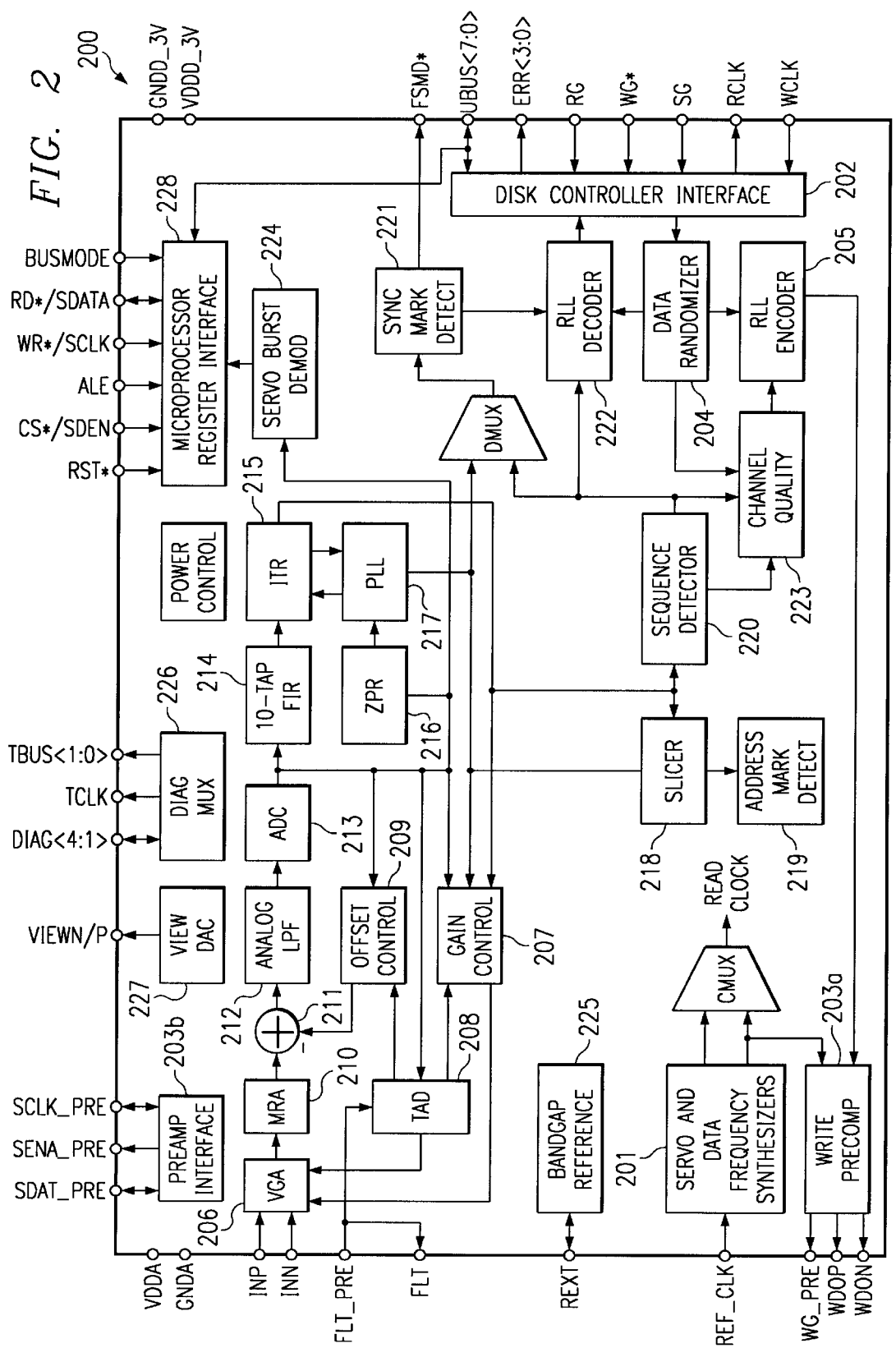

PHASE INTERPOLATION CIRCUITS AND METHODS AND SYSTEMS USING THE SAME

BACKGROUND OF THE INVENTION

1. Field of the Invention

The present invention relates in general to electronic circuits and systems and in particular clock generation circuits, systems and methods employing phase interpolation.

2. Description of the Related Art

Many digital and mixed digital-analog circuits and systems operate from a set of clocks derived from a single master clock. Typically, these clocks are generated using a programmable phase-locked loop (PLL) including a phase detector, charge pump, loop filter, ring oscillator, frequency dividers, and associated control circuitry. However, notwithstanding their wide use, traditional PLLs are significantly limited in their capacity to generate signals with precise phase relationships.

Since many state-of-the-art circuits and system require the generation of clock signals with more precise phase relationships than those produced by traditional PLLs, new techniques are required. Among other things, circuits, systems and methods are needed for the generation of signals with precise phase relationships. Moreover, such circuits, systems and methods should be programmable with fine or very fine phase resolution.

SUMMARY OF THE INVENTION

According to one embodiment of the principles of the present invention, a signal generator is disclosed which includes oscillator circuitry for generating first and second signals having a selected phase relationship. An interpolator interpolates between the phase of the first signal and the phase of the second signal to generate a third signal having a phase between the phases of the first and second signals.

The principles of the present invention support the generation of clock signals having a more precise phase relationship than those produced by traditional phase locked loops. In addition to enhanced precision, the inventive principles are also embodied in circuits, systems and methods which allow phase programmability of a given signal with fine or very fine phase resolution.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 is a more detailed block diagram of read/write channel;

DESCRIPTION OF THE PREFERRED EMBODIMENTS

The principles of the present invention and their advantages are best understood by referring to the illustrated embodiment depicted in FIGS. 1–10 of the drawings, in which like numbers designate like parts.

Figure 1:
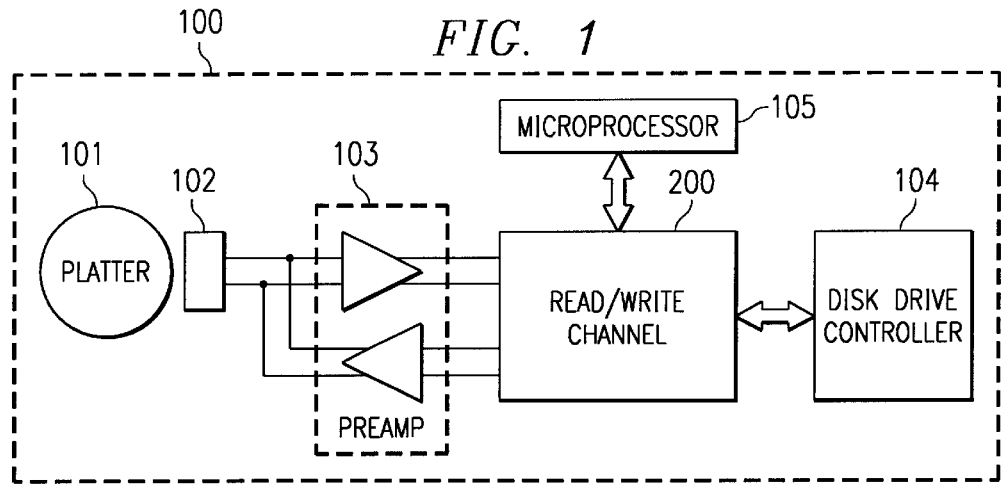
FIG. 1 is a high level functional block diagram of an exemplary mass storage subsystem, such as a disk drive subsystem, suitable for describing preferred embodiments of the principles of the present invention.

FIG. 1 is a high level functional block diagram of an exemplary mass storage subsystem, such as a disk drive subsystem 100, suitable for describing preferred embodiments of the principles of the present invention. Mass storage system 100 operates in conjunction with a magnetic disk or platter which stores bits of data as a sequence of magnetic state transitions. Platter 101 stores one channel of data per side, with each side divided into concentric circles or tracks which are in turn divided into sectors. As platter 101 rotates on a spindle, a read/write head 102 attached to a moveable arm over the surfaces of the platter, read or write bits of data as a function of magnetic flux. Typically, data is stored in a sequence which includes a sector number, a gap, the actual data including an error correction code, followed by a gap and the sector number for the next sector. Data are typically stored using a run-length limited (RLL) code.

Analog data being transmitted to and from read/write head 102 pass through preamplifier 103 which amplifies the voltage of the respective signals. In turn, data being exchanged with read/write head 102 passes through a read/write channel 200, which will be discussed further below in conjunction with FIG. 2. Read/write channel 200 operates in conjunction with a disk drive controller 104, and in some embodiments, additionally in conjunction with a microprocessor 105.

The preferred embodiment of read/write channel is best described by considering the read, write and servo modes of operation and the detailed block diagram of FIG. 2.

Figure 3:
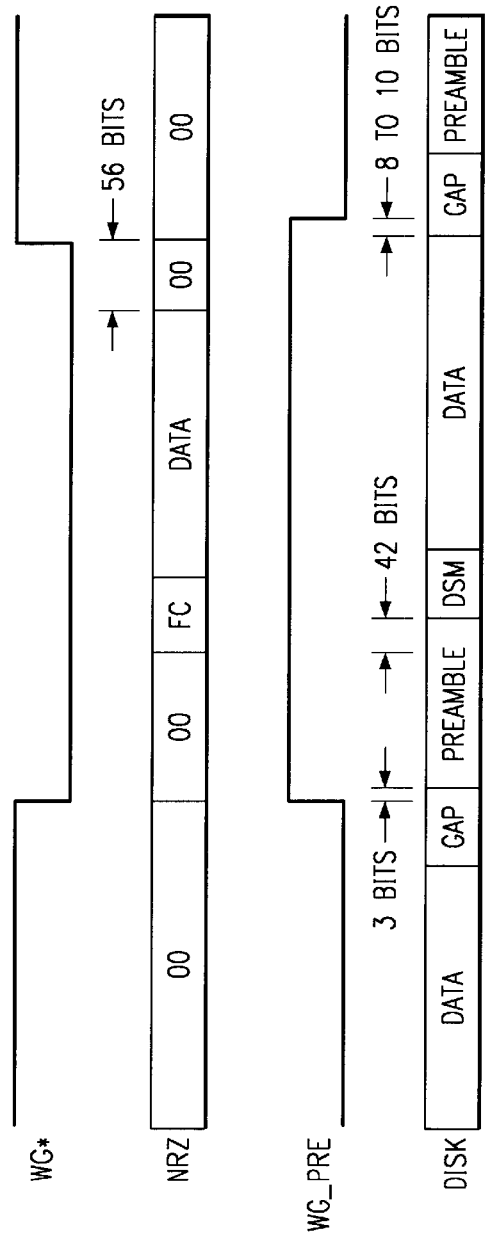
FIG. 3 is a timing diagram of an exemplary write operation.

Consider first a typical write operation to platter 101, as illustrated in the timing diagram of FIG. 3. During the write operation, a data synthesizer clock generated in servo and data frequency synthesizers block 201 is used to time the transitions. Data and control signals are received from the disk controller through disk controller interface 202. The inputs to disk controller interface 202 include a write gate (WG*) which enables the write data path, a read gate (RG) which enables the read data path and the servo gate (SG) which enables the servo read path.

When the write gate WG* transitions to a logic low, the data controller first writes a predetermined number of zeros equal to the preamble length minus the write path latency to controller interface 202. Read/write channel 200 then outputs the preamble pattern to read/write head 102. This is followed by a transmission to interface 202 by the disk controller of a data synch byte, followed by a number of placeholder bytes. Read/write channel 200 next writes the data synch mark (DSM) pattern through write precompensation interface 203a, while ignoring the placeholder bytes received at its NRZ port from the disk controller.

The output port of write precompensation interface 203a includes a pair of pseudo-ECL differential analog outputs WDON and WDOP, and an associated write gate WG__PRE, for transmitting data to preamplifier 103.

Following the synchronization bytes, disk controller 104 transfers the data bytes along with a pad through disk controller interface 202. A data randomizer 204, when enabled, randomizes the data received from the disk controller to equalize the probability of occurrence of worst-case pattern. The output from data randomizer 204 is passed to a an RLL encoder 205 for encoding before their transmission to read/write compensation circuitry 203. In turn, write precompensation circuitry 203 includes a pseudo-ECL (PECL) write data interface for driving data to the write path through preamplifier 103.

Write precompensation circuitry 203a adjusts the timing of the transfer of information to preamplifier 103 in response to the bit pattern output from the RLL encoder 205. When bits are closely recorded on the media, the transitions of one bit can affect the preceding bit, causing the apparent time of the earlier bit to lengthen (that is, to shift). Write precompensation is used to correct for this nonlinear bit shift. To correct for the sift, the write precompensation circuit anticipates the shift based upon the pattern output from the RLL encoder 205. Then, the timing of the rising and falling edges of the earlier bit is intentionally shifted so that, after the subsequent bit is written, the previous bit actually appears at the correct time.

Now consider an exemplary read operation from platter 101 through read/write channel 200 to disk controller 105. During a disk read, the read byte clock (RCLK) output from interface 202 is used to clock data to disk controller 104 and additionally is used by disk controller 103 to generate the write byte clock (WCLK), used to clock data from the disk controller to interface 202 during a write.

Data from preamplifier 103 is received at the inputs (INP, INN) of a digitally controlled variable gain amplifier (VGA) 206, under the control of gain control loop 207 and thermal asperity detector (TAD) 208. VGA 206 maintains a constant signal amplitude at the inputs to the following analog-to-digital converter stage.

The output from VGA 206 is passed through MR asymmetry compensation (MRA) block, which compensates for typical distortions(asymmetries) that can occur with certain MR and GMR read heads.

After offset compensation is applied by summer 211, the analog data is passed through tunable analog low pass filter (LPF) 212 which shapes the read-back signal being passed to the inputs of analog to digital converter 213. In the preferred embodiment, analog to digital converter 213 is a 6-bit flash analog to digital converter which generates digital samples in response to the timing base provided by the data synthesizer. The digitized signal is then passed through a 10-tap digital finite impulse response (FIR) equalization filter 214. Among other things, FIR filter 214 compensates for changing equalization needs from head to head and zone to zone.

Interpolated timing recovery (ITR) filter 215 shifts the phase of the samples output from FIR filter 214 using time varying coefficients which are generated a function of the current phase of the FIR filter output. ZPR block 216 is used to determine the initial phase used by ITR filter 215 using the first 16 valid samples output from A to D converter 213.

Gain control loop 207 adjusts the VGA gain such that a constant amplitude signal is seen at the output of either A to D converter 213 or ITR filter 215, as selected in register. Additionally, the output from A to D converter 213 can have a significant DC offset due to residual analog error in VGA 206, offsets in low pass filter 212, or offsets generated in A to D converter 213 itself. Offset control loop 209 cancels these offsets on a real time basis.

Both the gain control and offset control loops require information about the channel-bit sequence and/or polarity. This information is provided by setting the thresholds in slicer 218 such that the slicer admits +1 for non-negative samples and −1 for negative samples. Soft address mark detector 219 detects the soft address mark on platter 101 for performing an auto zero sequence. Additionally, soft address mark detector 219 is used at spin-up and to recover orientation after two or more servo sync mark detection failures.

A target sequence detector (DET) 220 reconstructs the channel bit stream from the analog filtered and digitally equalized samples output from ITR filter 215.

The output from sequence detector 220 is switched to synch mark detector 221. When a synch mark is detected, the signal FSMD* is asserted and transmitted to the disk controller. RLL decoder 222 decodes the read data being transmitted to disk drive control 104.

Channel quality circuitry 223 measures the nature and quality of data passing through the channel such as sampling errors, pr4 confidence metrics, detector residuals, and phase errors. Thermal asperity block 208 is provided to counter large transient dc offsets which are produced when an MR head encounters a physical obstruction at or near the surface of platter 101.

In the preferred embodiment, the control loops of read/write channel 200 operate in either an acquisition mode or tracking mode. In the acquisition mode, which is automatically entered when valid samples become available after the signal at the RG* pin transitions active, the control loops are preferably programmed to respond quickly in order to allow fast acquisition. In the tracking mode, the control loops are preferably programmed to respond more slowly in order to minimize the effect of offset, gain, and phase errors. The change in response characteristics between the two modes is controlled by the switching of the loop filter coefficients.

Figure 5:
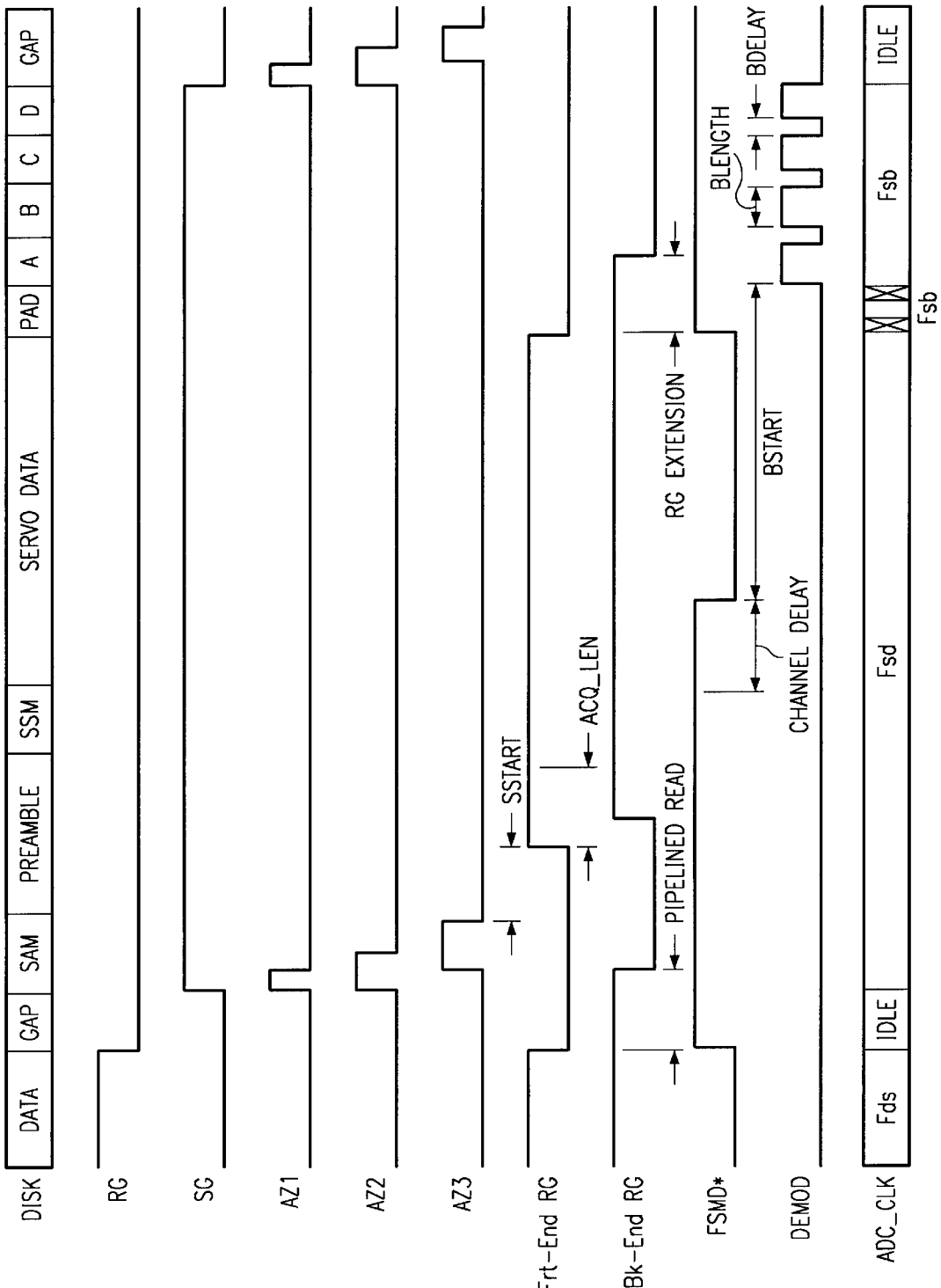
FIG. 5 shows an exemplary timing diagram of servo mode operation.
Figure 7B:
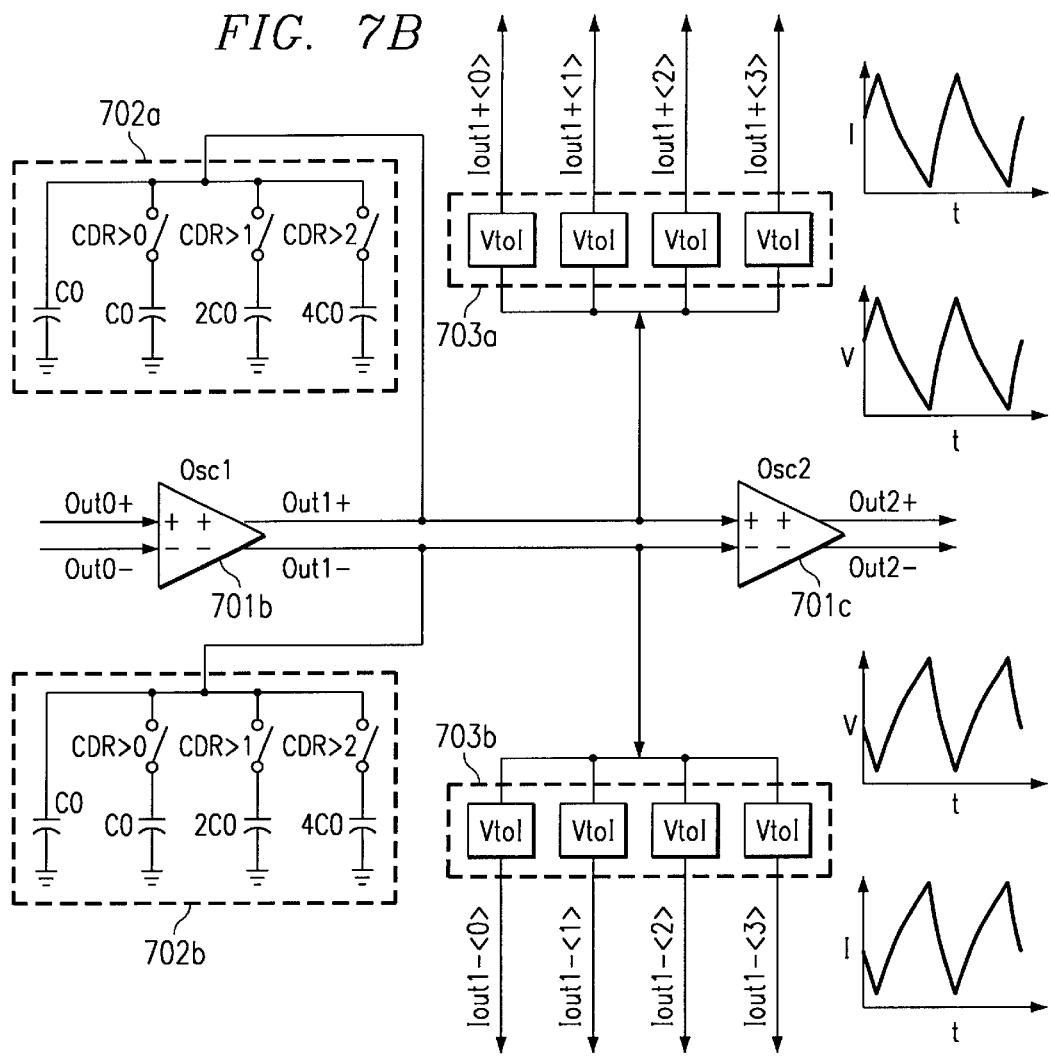
FIG. 7B A illustrates in particular detail a pair of stages, namely stages Osc1 and Osc2.

In the servo mode of operation, read/write channel 200 operates in a manner similar to that described above for a read operation. An exemplary timing diagram of servo mode operation is shown in FIG. 5. In this case, the operations controlled by the servo gate (SG) servo data decoder is used in place of RLL decoder 222. Following synchronous servo data detection and decoding, asynchronous servo burst demodulation is performed. Servo burst area detector (DEMOD) 224 monitors the output of analog to digital converter 213 and detects servo burst amplitude by sampled area detection. The disk drive servo system uses the detected information for estimating fractional track position. Additionally, in the servo mode, the requisite clocks are generated by the servo frequency synthesizer of block 201. Servo burst data is emitted on the 8-pin NRZ (UBUS) port in the servo mode.

Microprocessor interface 228 provides the interface to an external microprocessor, when used. The BUSMODE port is used to select between the Serial and Unified Bus (UBUS) interface modes. Interface 228 and disk controller interface 202 share an 8-bit unified bus interface UBUS in the UBUS mode. The UBUS port also provides the NRZ data interface to the disk controller as well as the address/data interface for the microprocessor. In the serial interface mode may be selected, the UBUS port is used exclusively as interface to the external disk controller.

The RD*/SDAT port exchanges address and data synchronized with the serial clock (SCLK) in the serial mode and receives a read strobe RD*, which, along with the chip select signal CS*, allowing internal registers to be accessed via the UBUS in the UBUSmode. Addresses on the UBUS are latched-in with the signal ALE. In the serial mode, the serial data enable signal SDEN enables the serial microcontroller interface. The reset signal RST* stops all read/write channel operations, deasserts all outputs and sets all bidirectional ports to a high impedance state.

With respect to the NRZ data interface, the RCLK pin receives a byte rate clock from the disk controller and is synchronous with data on the UBUS. When enabled, the ERR port allows read/write channel 200 to transmit error pointers to the disk controller.

Figure 6:
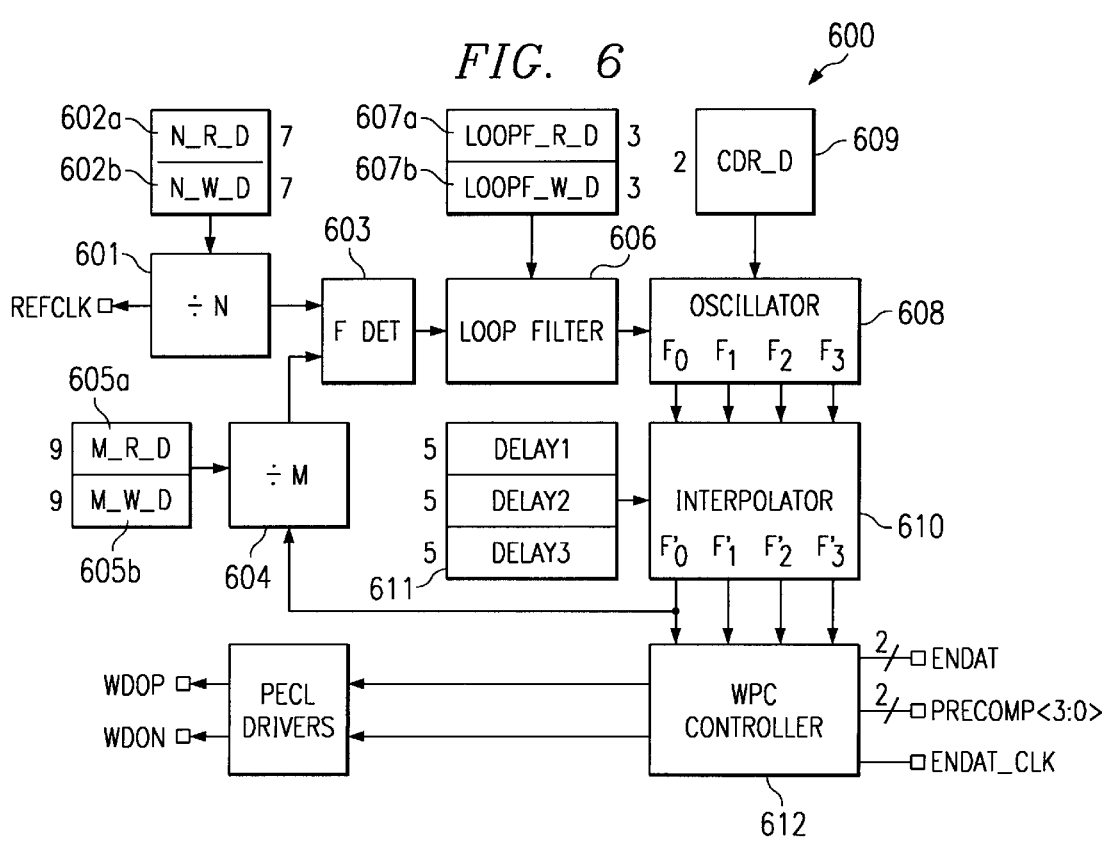
FIG. 6 is a more detailed functional block of write precompensation circuit block and its interconnection with the data synthesizer portion of synthesizer block.

FIG. 6 is a more detailed functional block of write precompensation circuit block 202 and its interconnection with the data synthesizer portion of synthesizer block 201, shown generally at 600. Write precompensation circuitry delays the writing of certain logic "1s" to counter nonlinear bit shifting which can occur, for example, when a "11" pattern is being written in d=0 RLL code. In this case, the second transition can be subjected to a nonlinear bit shift which is compensated for by WPC 203.

In the preferred embodiment, the reference clock REFCLK is divided in block 601 by divisor N, which is set for a read operation in register 602a (N_R_D) and for a write operation in register 602b (N_W_D). The resulting frequency is passed to the phase detector (or alternatively a phase-frequency detector) 603 where it is compared against the frequency divided from block 604 in the feedback loop. The frequency dividend M is set for a read in register 605a (M_R_D) and for a write in register 605b (M_W_D). The frequency of the data clock is therefore:

$$F_{OSC} = \frac{M\_D}{N\_D} \cdot F_{REF}$$

The output from phase detector is passed to loop filter 606, which is also programmable in register, with register 607a (LOOPF_R_D) setting the read synthesizer update frequency and register 607b (LOOPF_W_D) setting the write synthesizer update frequency. The operating range of loop filter 606 is adjusted to match the update rate of phase detector 603.

The Channel Data Rate operating range is controlled by CDR register 609, which sets the center operating frequency of variable frequency oscillator 608. Four phases are tapped from oscillator 608 and presented to interpolator 610. Interpolator 610 and oscillator 609 will be discussed in further detail below, but generally interpolator 610 includes a reference interpolator cell and three programmable interpolator cells controlled by the contents of Delay Register set 611. Depending on the mode and mapping selected, each data "1" is written from one of these interpolation (delay) cells.

The phases generated by interpolator 610 are sent to WPC controller 612, which selects one phase to clock out the current data ENDATA received from the RLL decoder while accounting for non-linear bit shift.

Figure 7A:
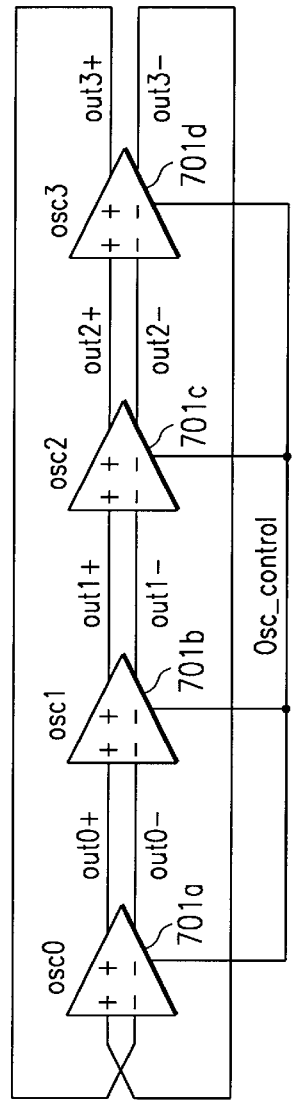
FIG. 7A illustrates the preferred embodiment of oscillator which employs four oscillator stages (Osc0–Osc3)
Figure 4:
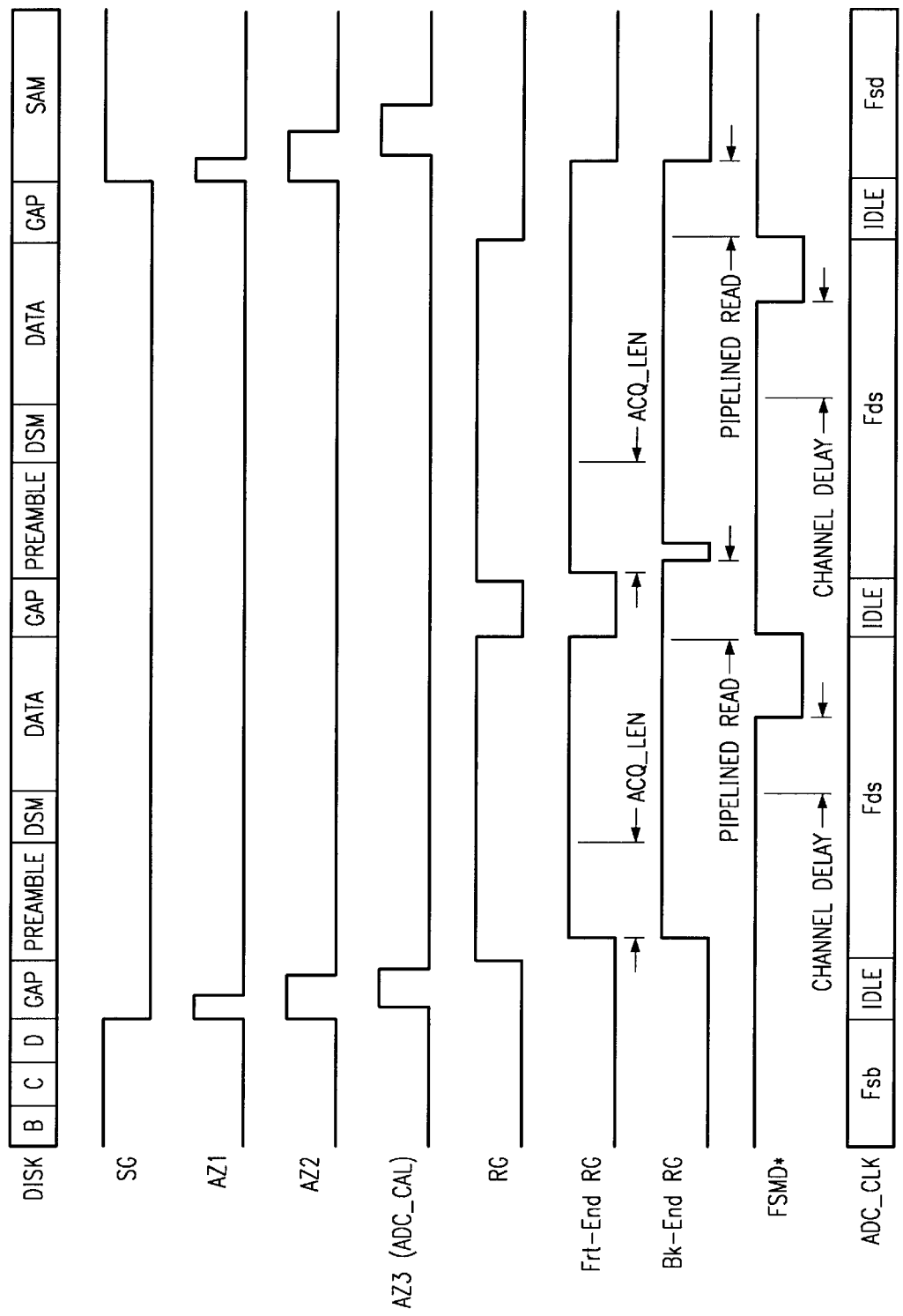
FIG. 4 is a timing diagram illustrating the continuous power mode.

FIG. 7A illustrates the preferred embodiment of oscillator 608 which employs four oscillator Stages (Osc0–Osc3) 701a–701d. A pair of stages, namely stages Osc1 and Osc2 are shown in particular detail in FIG. 7B.

At each pair of differential outputs ($Out_x+$, $OUT_x-$) of each stage 701 is a set of switched capacitors 702a or 702b which are used to set the Channel Data Rate (CDR)in accordance with the contents of CDR control register 609. Each of the differential pair of stage outputs is associated with a set of voltage-to-current taps 703a or 703b. As a result, each differential output voltage pair is converted to four differential current pairs Ioutx–<y> and Ioutx+<y>, where x is the stage number from 0 to 3 and y is the tap number from 0 to 3.

The four differential current pairs output from each stage 701 are equal in magnitude. The phase difference between the output currents of adjacent stages however is 180/n degrees, where n is the number of stages in the oscillator ring. In the present case, where the ring has four stages, the currents from adjacent stages differ in phase by 45 degrees. Hence, taking the currents Iout0<y> output from Stage 0 to be the reference (phase 0), currents Iout1<y> are shifted 45 degrees from the reference, currents Iout2<y> shifted 90 degrees from the reference, and currents Iout3<y> shifted 135 degrees from the reference.

Figure 8A:
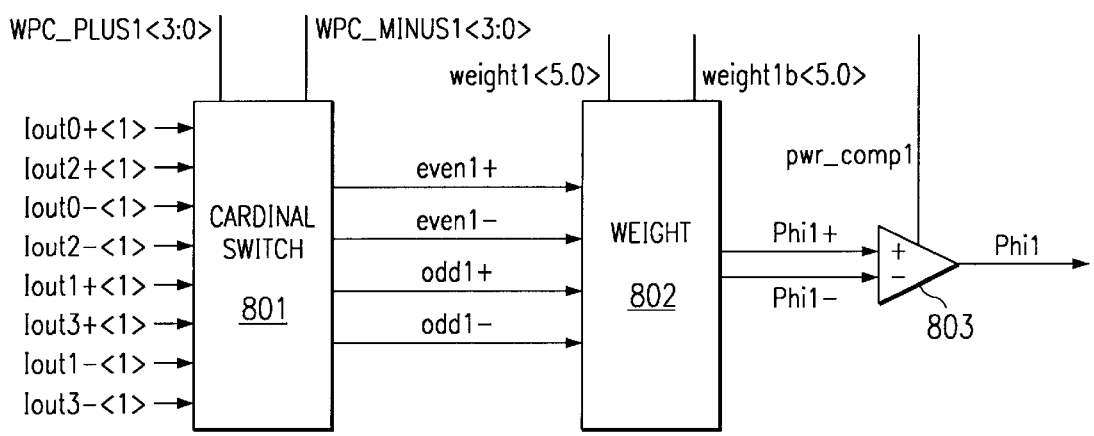
FIG. 8A illustrates that for each WPC phase $Phi_x$, the currents output from taps $703a,b$ are passed to a cardinal switch.

For each WPC phase $Phi_y$, the currents output from taps 703a,b of each oscillator stage are passed to a corresponding cardinal switch 801, one of which is shown in FIG. 8A. Cardinal switches 801 select which of the outputs are used to accomplish the phase interpolation. For an N stage differential ring, the cardinal switches select between 2N possible taps.

In FIG. 8A, where the clock phase Phi1 is being generated, the differential current pair Ioutx+/–<1> is passed to the cardinal switch 801 inputs from the corresponding oscillator stages 701. By programming corresponding registers WPC_PLUSy<3:0> and WPC_MINUSy<3:0>, two differential current pairs are selected as eveny+, eveny–, oddy+and oddy–, again where y is the clock phase number, are switched to weights 802, and thereafter to comparator 803. In the example shown in FIG. 8A, the corresponding cardinal switch 801 can select between taps Iout0/–<1> and Iout2+/–<1> to generate the even components eveny+/– and between taps Iout1+/–<1> and Iout3+/–<1> to generate the odd components odd+/–.

Figure 8B:
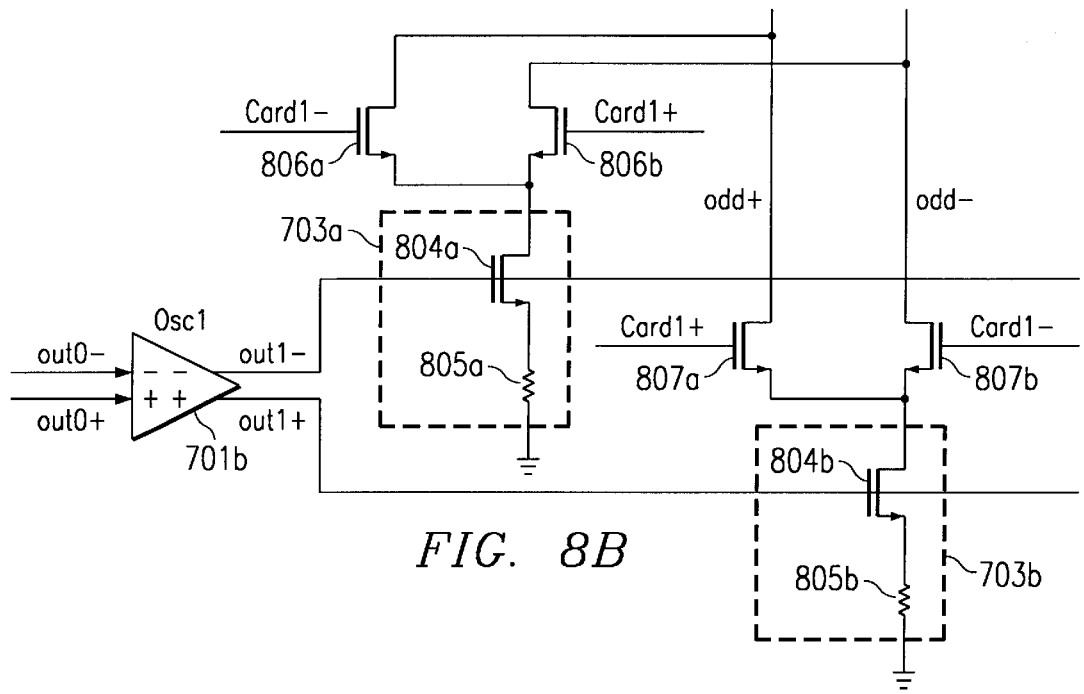
FIG. 8B is a more detailed diagram of a selected one of the cardinal switches of FIG. 8A.

FIG. 8B is an electrical schematic diagram of the cardinal switches controlling one pair of voltage-to-current taps 702 at the output of oscillator stage 1. Here, the corresponding tap from group 703a comprises a transistor 804a having a gate controlled by the -output from the oscillator stage and a resistor 805a for setting the current level. Similarly, the corresponding tap from group 703b comprises transistor 804b, controlled by the +output from oscillator stage 1 and resistor 805b. Transistors 806a,b comprise the cardinal switches, with signals Card1– and Card1+ respectively selecting how currents from transistors 804a,b can be injected into nodes odd+ and odd–.

Figure 9:
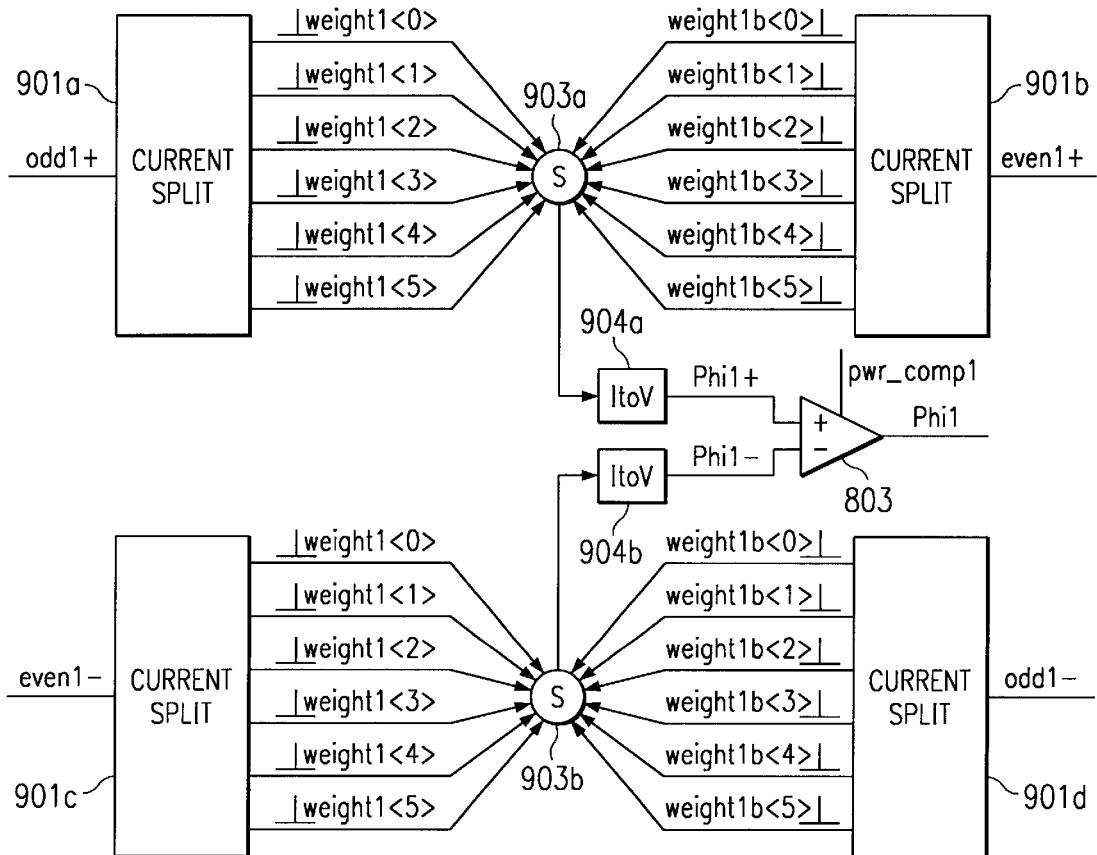
FIG. 9 shows each of these two currents being split is turn into 6 equal amplitude currents by a corresponding current splitter.
Figure 10:
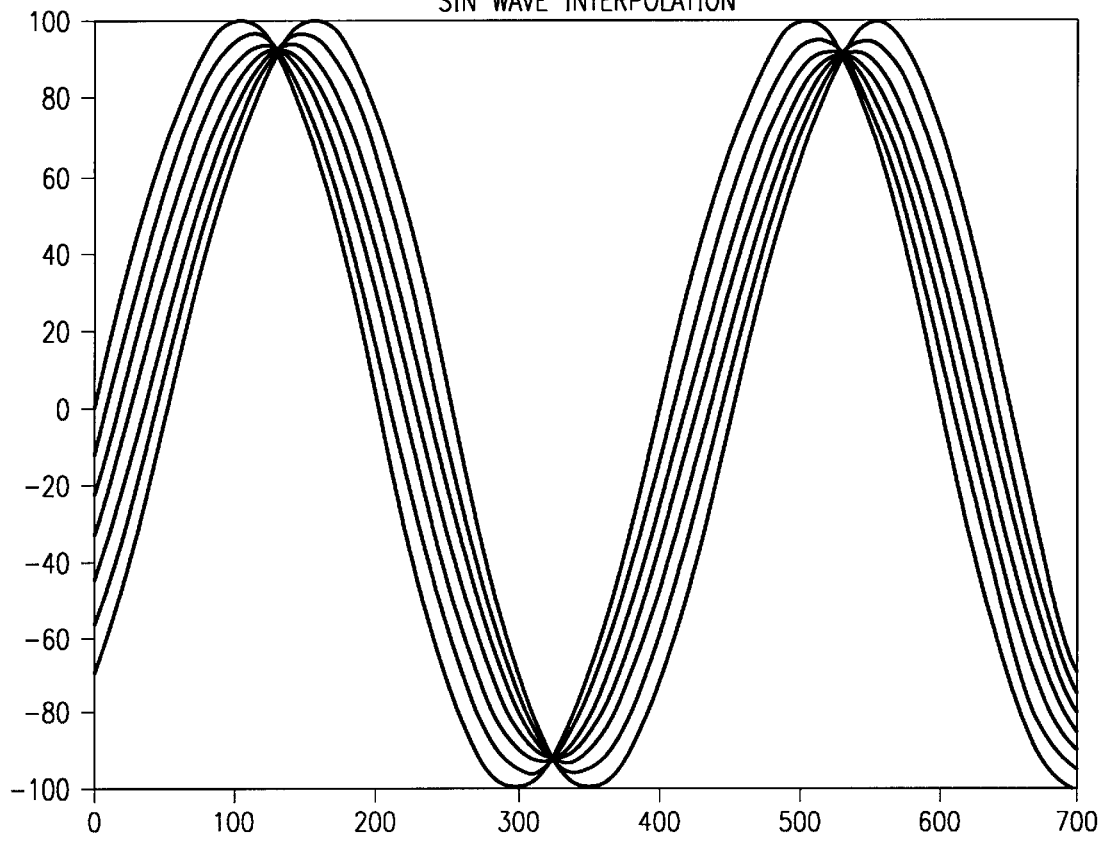
FIG. 10 graphically depicts phase interpolation in accordance with the illustrated embodiment.

As shown in FIG. 9, each of these two currents is turn split into 6 equal-amplitude currents by a corresponding current splitter 901a–901d. After splitting, the resulting currents are selectively switched by associated sets of weight switches 902a–902d to the inputs of summers 903a and 903b. After summing, the resulting currents are converted back into a pair of differential voltages by circuit blocks 904a and 904b which then a appear at the inputs of comparator 803. The output from comparator 905 is the clock signal of phase $Phi_y$ for the stage.

The interpolated phase of $Phi_y$ is directly proportional to the currents switched to the summers 903. Phase interpolation is graphically depicted in FIG. 10. Accordingly, consider for discussion purposes the case where Phi$_1$ is being generated by selecting the phase 1 currents from Stage 0 and Stage 1 (i.e. Iout0+/−<1> and Iout1+/−<1> through the corresponding switch 801. Again, Stage 0 outputs currents at the reference phase of 0 degrees and Stage 1 currents with a phase shift of 45 degrees. Using weight switches 802, the phase of Phi1 can be stepped in approximately 7.5 degree increments in accordance with Table 1. It should be noted that unselected currents are simply dumped.

TABLE 1

| Number of Stage 0 Currents Used | Number of State 1 Currents Used | Number of Stage 0 Currents Dumped | Number of Stage 1 Currents Dumped | Phase Phi1 |
|---|---|---|---|---|
| 0/6 | 6/6 | 6/6 | 0/6 | 45° |
| 1/6 | 5/6 | 5/6 | 1/6 | 37.5° |
| 2/6 | 4/6 | 4/6 | 2/6 | 30° |
| 3/6 | 3/6 | 3/6 | 3/6 | 22.5° |
| 4/6 | 2/6 | 2/6 | 4/6 | 15° |
| 5/6 | 1/6 | 1/6 | 5/6 | 7.5° |
| 6/6 | 0/6 | 0/6 | 6/6 | 0° |

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed:

1. A signal generator comprising:
   oscillator circuitry for generating first and second signals having a selected phase relationship; and
   an interpolator for interpolating between a phase of said first signal and a phase of said second signal to generate a third signal having a phase between said phases of said first and second signals including:
      current splitter circuitry for splitting currents of said first and second signals into a plurality of intermediate currents; and
      current summer circuitry for summing ones of said plurality of intermediate currents selected by an associated set of switches.

2. The signal generator of claim 1 wherein said oscillator circuitry comprises an oscillator ring of N number of stages and said first and second signals differ in phase by 180/N degrees.

3. The signal generator of claim 1 and wherein said first and second signals generated by said oscillator ring comprise voltage signals and said signal generator further includes voltage to current conversion circuitry for converting said voltage signals into said currents of said first and second signals.

4. The signal generator of claim 1 wherein said first and second signals each comprise differential pairs of signals.

5. A signal generator comprising:
   oscillator circuitry for generating first and second signals having a selected phase relationship;
   an interpolator for interpolating between a phase of said first signal and a phase of said second signal to generate a third signal having a phase between said phases of said first and second signals; and
   a switch for selecting said first and second signals from a plurality of signals generated by said oscillator ring.

6. A clock generator for generating a clock of a selected phase comprising:
   a ring oscillator having a plurality of stages for generating a plurality of signals having preselected phase relationships;
   an interpolator for interpolating between selected output signals generated by said ring oscillator to obtain said clock of said selected phase comprising:
      a switch for selecting first and second ones of said output signals generated by said ring oscillator;
      a current splitter for splitting a current of each of said first and second signals selected by said switch into a plurality of intermediate signals each having a preselected current;
      a set of weight switches for selecting ones of said plurality of intermediate signals received from said current splitter;
      a summer for selectively summing said currents of said selected intermediate signals to generate a current of said selected phase; and
   circuitry for converting said current of said selected phase to a voltage generate said clock of said selected phase.

7. The clock generator of claim 6 wherein switch is operable to select said first and second signals generated by said oscillator ring from adjacent ones of said stages of said oscillator ring.

8. The clock generator of claim 7 wherein a phase difference between said first and second signals is 180/N degrees, wherein N is a number of stages in said oscillator ring.

9. The clock generator of claim 8 wherein said current splitter splits each of said first and second signals into M number of intermediate signals of equal currents, said weight switches selecting ones of said intermediate signals to provide a phase resolution of said selected phase of said clock of (180/N)/M degrees.

10. The clock generator of claim 9 and further comprising a second interpolator for generating a second clock of a second selected phase comprising:
    a second switch for selecting third and fourth ones of said signals generated by said ring oscillator;
    a second current splitter for splitting a current of each of said third and fourth signals selected by said switch into a plurality of intermediate signals each having a preselected current;
    a second set of weight switches for selecting ones of said plurality of intermediate signals received from said current splitter; and
    a summer for selectively summing said current of said selected intermediate signals to generate a current of said second selected phase.

11. The clock generator of claim 10 wherein said second switch of said second interpolator selects said third and fourth output signals from adjacent said stages of said oscillator.

12. An integrated circuit comprising:
    a clock generator for generating a plurality of clocks of varying phases comprising:

an oscillator ring having n number of stages, each stage shifting a received signal 180/n degrees;

a plurality of taps coupled to outputs of selected stages of the oscillator for providing currents of varying phases; and a plurality of interpolators, each interpolator comprising:

a switch for selecting first and second currents having first and second phases provided by corresponding taps;

current splitters for splitting each of the first and second currents into m number intermediate currents, wherein 180/n/m is a phase resolution of said interpolator;

a set of weight switches for selecting k number of the intermediate currents split from said first current and m-k number of the intermediate currents split from the second current; and a summer for summing the intermediate currents selected by the weight switches to generate a current with a phase interpolated from the phases of said first and second currents.

13. The integrated circuit of claim 12 and further comprising a phase-locked loop comprising:

a phase detector for comparing a phase of a first clock generated by selectively dividing a frequency of a reference clock with a phase of a second clock generated by selectively dividing a frequency of a selected clock generated by the clock generator; and a loop filter for filtering a signal output from the phase detector, an output of the loop filter passed to an input of the oscillator ring.

14. The integrated circuit of claim 12 and further including write precompensation circuitry for writing data to a magnetic storage media in response to a selected one of the clocks generated by the clock generator.

15. The integrated circuit of claim 12 wherein said integrated circuit comprises a read/write channel.

16. The integrated circuit of claim 12 wherein the taps provide currents as differential pairs.

17. A method of generating a clock phase by selectively interpolating first and second clock signals having a selected phase relationship comprising the steps of:

generating a plurality of clock signals having a selected phase relationship with respects to each other;

selecting the first and second clock signals from the plurality of clock signals;

splitting a current of each of the first and second clock signals to generate a plurality of currents each corresponding to a selected amount of phase resolution; and summing a selected number of currents split from the first clock signal with a selected number of currents split from the second clock signal to generate a signal with a phase interpolated between phases of the first and second clock signals.

18. The method of claim 17 wherein said step of splitting comprises the step of splitting each of the first and second clock signals into m number of equal currents and said step of summing comprises the step of summing k number of currents split from the first clock signal and m-k number of currents split from the second clock signal.

19. The method of claim 17 wherein said step of generating a plurality of clock signals comprises the step of generating a plurality of clock signals by tapping outputs of corresponding stages of a ring oscillator.

* * * * *